(12) United States Patent
Chen

(10) Patent No.: US 7,390,723 B2
(45) Date of Patent: Jun. 24, 2008

(54) ALIGNMENT METHOD OF USING ALIGNMENT MARKS ON WAFER EDGE

(75) Inventor: Chiu-Wang Chen, Huatan Shiang (TW)

(73) Assignee: Industrial Technology Research Institute, Hsinchu (TW)

( * ) Notice: Subject to any disclaimer, the term of this patent is extended or adjusted under 35 U.S.C. 154(b) by 387 days.

(21) Appl. No.: 11/138,348

(22) Filed: May 27, 2005

(65) Prior Publication Data

US 2006/0139643 A1 Jun. 29, 2006

(30) Foreign Application Priority Data

Dec. 28, 2004 (TW) .............................. 93140841 A

(51) Int. Cl.
*H01L 21/76* (2006.01)
*H01L 21/78* (2006.01)
*H01L 21/46* (2006.01)
*H01L 21/30* (2006.01)
*H01L 23/544* (2006.01)

(52) U.S. Cl. ........................ 438/401; 438/455; 438/462; 257/797; 257/E23.179

(58) Field of Classification Search ................. 438/401, 438/455, 462; 257/797, E23.179
See application file for complete search history.

(56) References Cited

U.S. PATENT DOCUMENTS

| 4,019,109 | A | | 4/1977 | McCoy et al. | ............... | 318/640 |
|---|---|---|---|---|---|---|
| 5,166,754 | A | | 11/1992 | Suzuki et al. | ............... | 356/401 |
| 5,236,118 | A | * | 8/1993 | Bower et al. | ................ | 228/193 |
| 6,479,371 | B2 | | 11/2002 | Noda | .......................... | 438/455 |
| 6,566,232 | B1 | * | 5/2003 | Hara et al. | .................. | 438/455 |
| 6,774,477 | B2 | * | 8/2004 | Han | ........................... | 257/686 |
| 6,938,334 | B2 | * | 9/2005 | Yu | ............................... | 29/830 |

* cited by examiner

*Primary Examiner*—Luan Thai
(74) *Attorney, Agent, or Firm*—Troxell Law Office, PLLC

(57) ABSTRACT

A method for stacking and bonding wafers in precision alignment by detecting alignment marks provided on wafer edges, comprising the steps of: (a) providing at least a first wafer having at least a first pattern and at least a second pattern disposed on the cross-section thereof, at least a second wafer having at least a third pattern and at least a fourth pattern disposed on the cross-section thereof, and at least a sensing device, while pairing the first pattern with the third pattern and pairing the second pattern with the fourth pattern; (b) actuating the first wafer and the second wafer for enabling the first to parallel the second wafer and to be a distance apart from the second wafer; (c) actuating the first wafer and the second wafer for bringing the two wafers to move toward each other while enabling the sensing device for detecting and determining whether or not the first pattern is in a position capable of matching with the third pattern and the second pattern in another position capable of matching with the fourth pattern; (d) bonding the first wafer and the second wafer while the first pattern matches the third pattern and the second pattern matches the fourth pattern.

6 Claims, 5 Drawing Sheets

FIG. 5B(Prior Atr)

ALIGNMENT METHOD OF USING ALIGNMENT MARKS ON WAFER EDGE

FIELD OF THE INVENTION

The present invention relates to a method for aligning fiducial marks provided on wafers, and more particularly, to a method for stacking and bonding wafers in precision alignment by detecting alignment marks provided on wafer edges.

BACKGROUND OF THE INVENTION

Generally, in a semiconductor process, alignment of wafers to each other is critical during the bonding step. It is noted that the common alignment system of an exposure apparatus used in the manufacture of semiconductor devices is capable of detecting alignment marks or reticle provided on a mask and a wafer so as to bring the mask and the wafer into a predetermined positional relation on the basis of the detected positional relationship between the mark and wafer, wherein the mask is usually transparent. Nevertheless, in additional to a simple stacking and bonding wafers in precision alignment, wafer bonding in the Micro-Electro-Mechanical Systems (MEMS) field may further consist of the bonding of face-to-face and face-to-back wafer stack. Currently, most bonding devices adopted the concept of the conventional exposure apparatus for aligning wafers to be bonded, that is, a first wafer with alignment marks etched thereon is first fed into a bonding device for detecting and recording the image of the first wafer by a photo-detecting means, and then a second wafer with alignment marks etched thereon is fed into the bonding device to be detected by the photo-detecting means and thus for bonding with the first wafer by aligning the second wafer with the recorded image of the first wafer. Moreover, a variation of the foregoing alignment process is achieved by simultaneously detecting the two wafers to be bonded by a combination of lens of the photo-detecting means. Also for enabling the simultaneously detection and alignment of wafers to be bonded, an infrared light is used for "see through" the wafers and acquiring images thereof since most devices are adapted for wafers having alignment marks etched on a surface thereof. The alignment error of these systems can be huge.

Please refer to FIG. 1, which is a schematic view of an alignment system as disclosed in U.S. Pat. No. 5,166,754. The alignment of an upper wafer 10 and a lower wafer 12 is performed by the sequence of: using a coupled charged device (CCD) lens 14 to detect an alignment mark 100 disposed on the upper wafer 10 through a via hole disposed on the lower wafer 12; and then bringing the upper wafer 10 and the lower wafer 12 into a predetermined positional relation on the basis of the detecting of the alignment marks 100 through the via hole 120 by using a adjustment device (not shown).

In another prior-art alignment system as shown in FIG. 2, an alignment mark 200 is disposed on an upper wafer 20 while an alignment marks 220 is disposed on a lower wafer 22 such that the alignment of the upper wafer 20 and the lower wafer 22 is performed by the sequence of: feeding the upper wafer 20 to a predefined position for enabling a CCD to detect and record the location of the alignment mark 200; feeding the lower wafer 22 to the predefined position for enabling the CCD to detect and record the location of the alignment mark 220; and then, bringing the upper wafer 20 and the lower wafer 22 into a predetermined positional relation on the basis of the detected positional relationship between the alignment marks 200, 220 by using an adjustment device (not shown).

It is yet another prior-art alignment system as shown in FIG. 3, where an CCD 34 is arranged at a predetermined position enabling the same to be able to detect an alignment mark 300 of an upper wafer 30 and an alignment mark 320 of a lower wafer 32 simultaneously so as to bring the upper wafer 30 and the lower wafer 32 into a predetermined positional relation on the basis of the detected positional relationship between the alignment marks 300, 320 by using an adjustment device (not shown).

Further, another prior-art alignment system disclosed both in U.S. Pat. Nos. 6,479,371 and 4,019,109 is shown in FIG. 4, in which both the alignment mark 400 disposed on a upper wafer 40 and the alignment mark 420 disposed on a lower wafer 42 are irradiated by a penetrating light source, such as X-ray, for enabling a CCD 44 to be able to detect the alignment mark 400 and the alignment mark 420 simultaneously so as to bring the upper wafer 40 and the lower wafer 42 into a predetermined positional relation on the basis of the detected positional relationship between the alignment marks 400, 420 by using an adjustment device (not shown).

Please refer to FIG. 5A to FIG. 5C, which are schematic diagrams showing an alignment sequence performed by an alignment system with dual-CCDs according to prior arts. The alignment of an upper wafer 50 and a lower wafer 52 is performed by the sequence of: using an upper coupled charged device (CCD) 54 to detect and record an alignment mark 520 disposed on the lower wafer 52 while the upper wafer 50 is at a withdrawn position as shown in FIG. 5A; feeding the upper wafer 50 to a predefined position while withdrawing the lower wafer 52 for enabling a lower CCD 56 to detect and record an alignment mark 500 disposed on the upper wafer 50 as shown in FIG. 5B; bringing the upper wafer 50 and the lower wafer 52 into a predetermined positional relation on the basis of the detected positional relationship between the recorded alignment marks 500, 520 by using an adjustment device (not shown). Accordingly, the actuating error introduced by the mechanism that brings the two wafers in contact can be minimized since the initial interval between the two wafers 50, 52 is minimized.

From the above description, it is noted that the actuating error still can not be avoid while the two wafer is brought into contact by a mechanism. Therefore, a method for stacking and bonding wafers in precision alignment is required.

SUMMARY OF THE INVENTION

It is the primary object of the invention to provide a method for aligning and bonding wafers in precision alignment.

To achieve the above object, the alignment method of the invention comprises the steps of:

(a) providing at least a first wafer having at least a first pattern and at least a second pattern disposed on the cross-section thereof, at least a second wafer having at least a third pattern and at least a fourth pattern disposed on the cross-section thereof, and at least a sensing device, while pairing the first pattern with the third pattern and pairing the second pattern with the fourth pattern; wherein the sensing device can be a CCD or a contact probe, etc., and each of the first, the second, the third, and the fourth pattern can be a two-dimensional figure or a three-dimensional structure;

(b) actuating the first wafer and the second wafer for enabling the first wafer to parallel the second wafer and to be a distance apart from the second wafer; and (c) actuating the first wafer and the second wafer for bringing the two wafers to move toward each other while enabling the sensing device to detect and determine whether or not the first pattern is in a position capable of matching with the third pattern and the second pattern in another position capable of matching with the fourth pattern.

In a preferred embodiment of the invention, the alignment method further comprises the steps of:

(d) adjusting the first wafer and the second wafer for enabling the first pattern to match with the third pattern and the second pattern to match with the fourth pattern while the first pattern is in a position incapable of matching with the third pattern and the second pattern is in another position incapable of matching with the fourth pattern; and (e) bonding the first wafer and the second wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5A~FIG. 5C are schematic diagrams showing an alignment sequence performed by an alignment system with dual-CCDs according to prior arts.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 2:
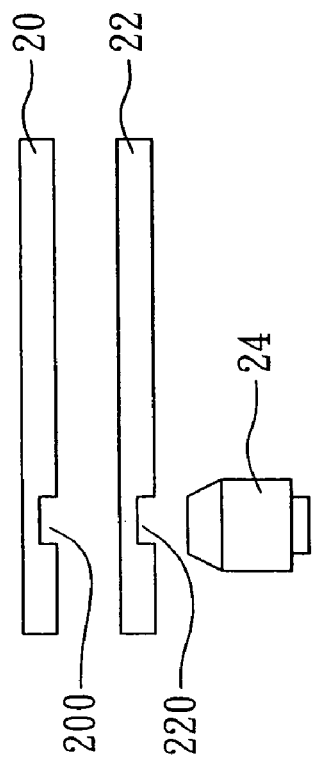
FIG. 2 is a schematic view of an alignment system according to prior arts.
Figure 1:
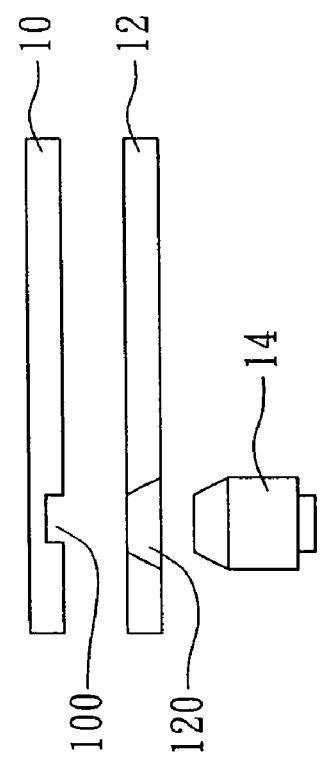
FIG. 1 is a sectional view of an alignment system as disclosed in U.S. Pat. No. 5,166,754.
Figure 4:
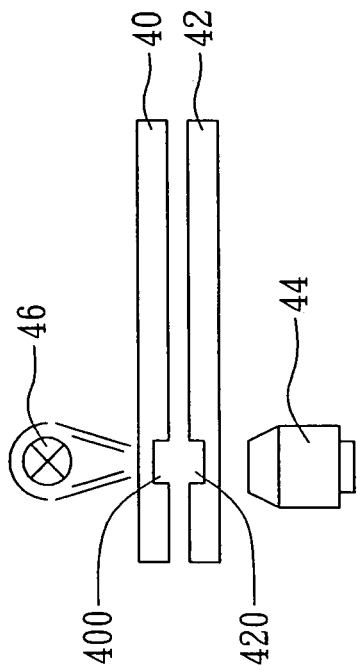
FIG. 4 is a schematic view of an alignment system using penetrating light.
Figure 3:
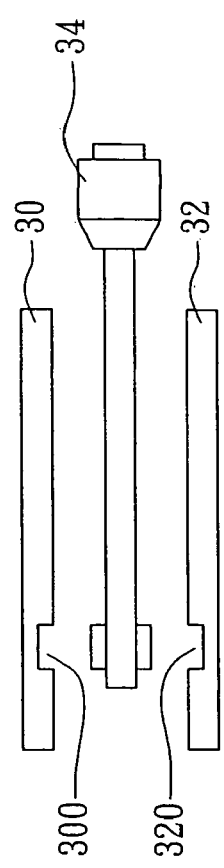
FIG. 3 is a schematic view of another alignment system according to prior arts.
Figure 5A:
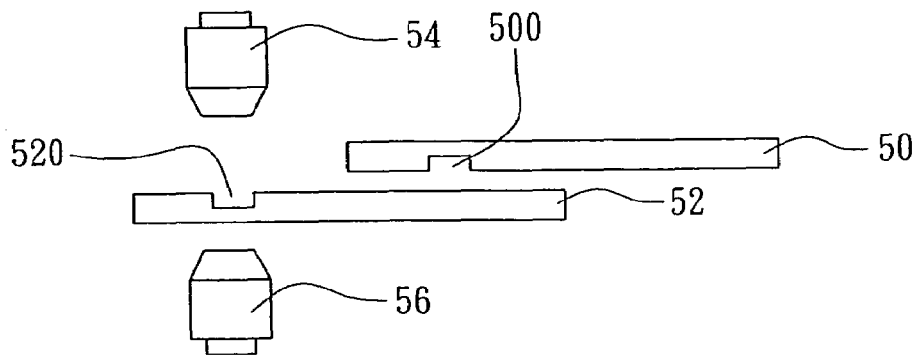
Figure 5C:
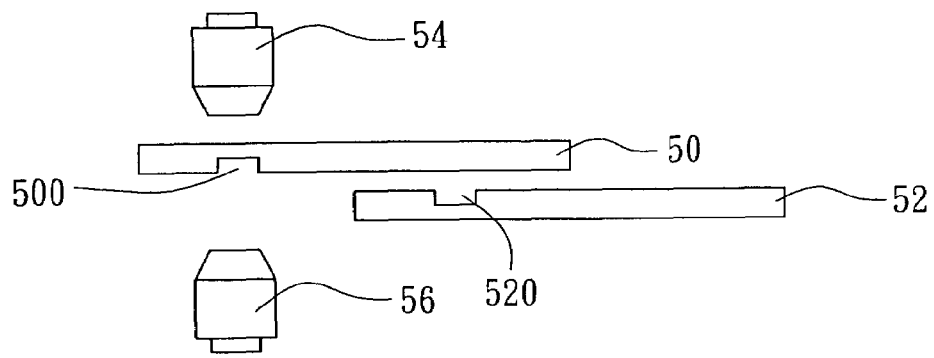
Figure 5C:
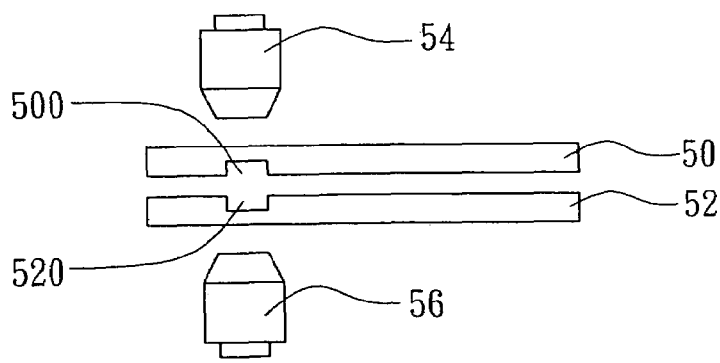
Figure 6:
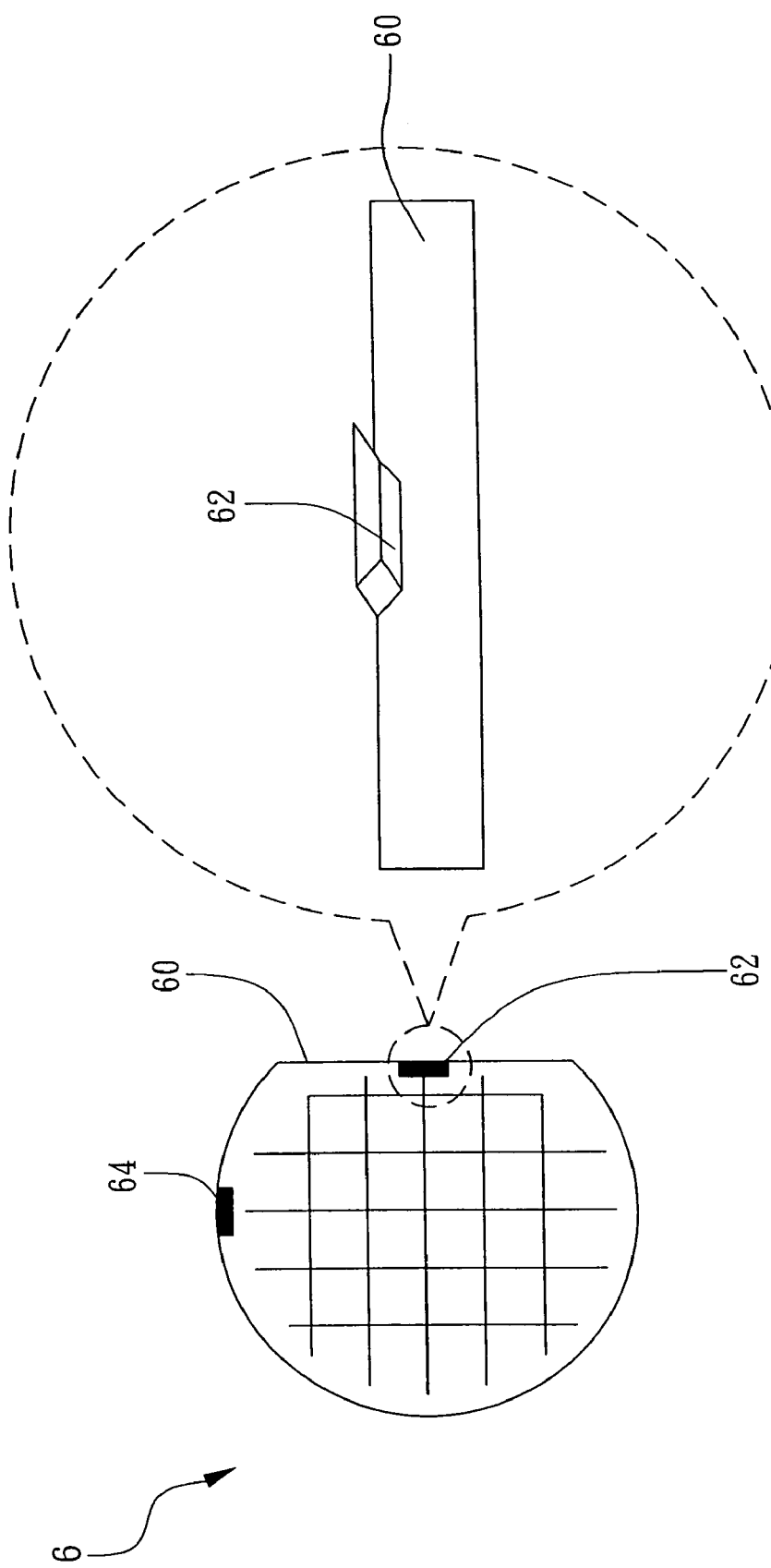
FIG. 6 is an enlarged view of an alignment mark disposed on a wafer according to the present invention.

Please refer to FIG. 6, which is an enlarged view of an alignment mark disposed on a wafer according to an embodiment of the present invention. In FIG. 6, a first pattern 62 is disposed at a wafer flat 60 of the wafer 6 while a second pattern 64 being disposed at a location on the perimeter of the wafer 6, moreover, the first pattern 62 and the second pattern 64 are orthogonal to each other. Nevertheless, the positional relationship between the first pattern 62 and the second pattern 64 can be varied, which can be next to each other or can be apart by a predetermined angular angle for instance. That is, the positional relationship between the first pattern 62 and the second pattern 64 is only constrained by the requirement that it should be distinct enough to be used for recognizing the movement of the wafer in X and Y direction as well as the angular inclination θ.

Figure 7:
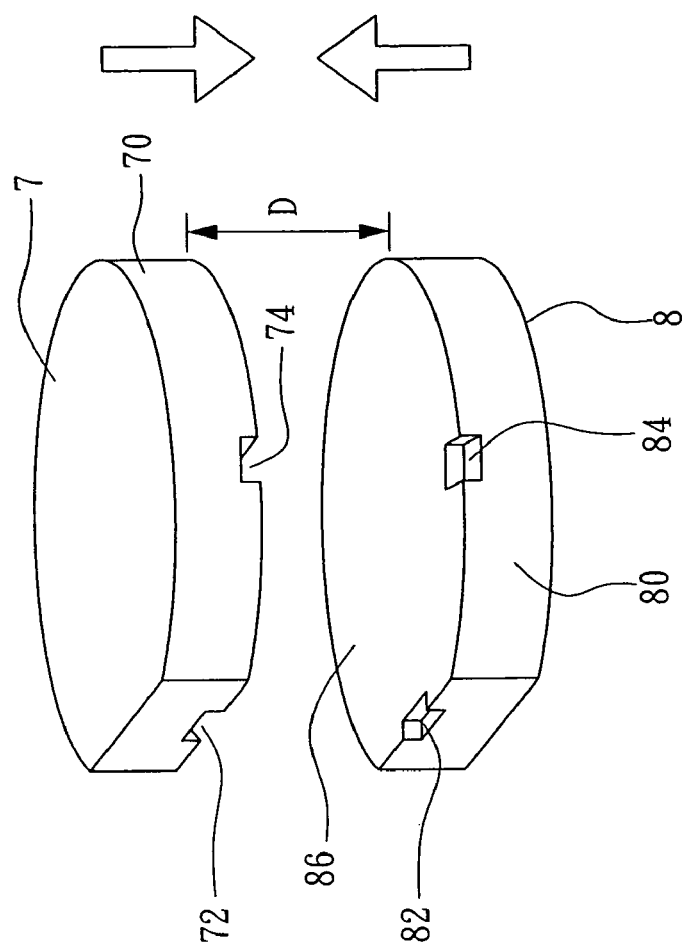
FIG. 7 is a schematic diagram depicting an embodiment of the present invention.
Figure 7:
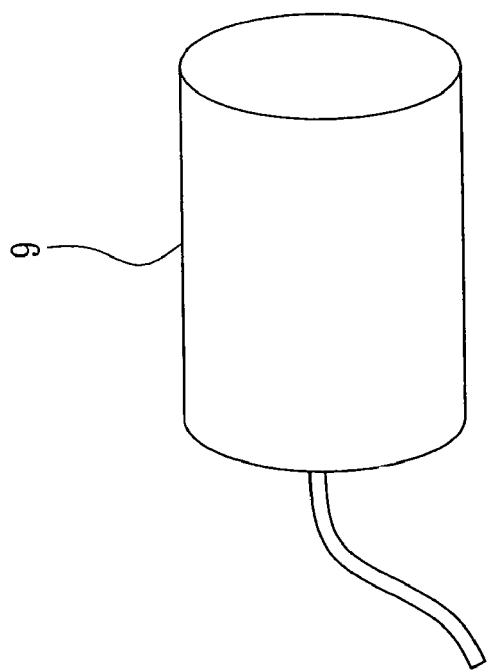

An embodiment of the present invention is shown in FIG. 7. The wafers 7 and 8 shown herein are arranged parallel to each other and apart by a distance D, wherein the wafer 7 have a first pattern 72 and a second pattern 74 disposed on the cross-section thereof, and the wafer 8 have a third pattern 82 and a fourth pattern 84 disposed on the cross-section thereof.

When the wafer 7 aligns with the wafer 8 precisely, the first pattern 72 will match to the third pattern 82 while the second pattern 74 will match the fourth pattern 84. In the embodiment shown in FIG. 7, a sensing device 9 is placed at a side 70 of the wafer 7 as well as a side 80 of the wafer 8, which is used to locate the positions of the first pattern 72 and the third pattern 82 for determining the positional relationship between the two. Simultaneously, another sensing device is used to locate the positions of the second pattern 74 and the fourth pattern 84 for determining the positional relationship between the two, which is required since the first pattern 72 and the second pattern 74 are orthogonal to each other and the same as to that of the third pattern 82 and the fourth pattern 84. In addition, the sensing device 9 can be a coupled charged device and the like.

During a aligning and bonding process, the wafer 7 and the wafer 8 are actuated for bringing the two wafers 7, 8 to move toward each other while enabling the sensing device 9 to detect the positional relationship between the first pattern 72 and the third pattern 82 and thereafter send the sensing result of positional relationship to a calculating means (not shown) so as to direct an adjusting device (not shown) to adjust the relative position of the first pattern 72 and the third pattern 82 basing on the calculation of the calculating means and finally enable the first pattern 72 to match with the third pattern 82. In another preferred embodiment, one of the two wafers, such as the wafer 7, is constrained while another unconstrained wafer, i.e. the wafer 8, is actuated to move toward the wafer 7 such that the alignment precision can be improved.

Similarly, during the wafer 7 and the wafer 8 are actuated for bringing the two wafers 7, 8 to move toward each other, another sensing device is also being enabled to detect the positional relationship between the second pattern 74 and the fourth pattern 84 and thereafter send the sensing result of positional relationship to the calculating means (not shown) so as to direct the adjusting device (not shown) to adjust the relative position of the second pattern 74 and the fourth pattern 84 basing on the calculation of the calculating means and finally enable the second pattern 74 to match with the fourth pattern 84. By virtue of this, the two wafers 7, 8 are continuously being monitored and adjusted for precision alignment until they are bonded, which can avoid the alignment errors of prior arts attributed to an error introduced by the mechanism that brings the two wafers in contact after being aligned.

Further, each of the first, the second, the third, and the fourth pattern is selected from the group consisting of a two-dimensional figure and a three-dimensional structure. For instance, as the sensing device is a CCD, the abovementioned patterns can be two-dimensional figures, or three-dimensional structures, or the combination of the two. However, if the sensing device is a contact probe, the patterns must be three-dimensional structures.

In a preferred embodiment of the invention, as more than one sensing devices are adopted for sensing the abovementioned patterns, the sensing devices can be all being CCDs, all being contact probe, or the combination of the two. These abovementioned sensing devices and variations of combination thereof are enveloped in the scope of the present invention and can be accomplished by some other sensing device in accordance with the description of the present invention, wherein the redundant description about those are omitted herein.

While the preferred embodiment of the invention has been set forth for the purpose of disclosure, modifications of the disclosed embodiment of the invention as well as other embodiments thereof may occur to those skilled in the art.

Accordingly, the appended claims are intended to cover all embodiments which do not depart from the spirit and scope of the invention.

What is claimed is:

1. A method for stacking and bonding wafers in precision alignment by detecting alignment marks provided on wafer edges, comprising the steps of:
    (a) providing at least a first wafer having at least a first pattern and at least a second pattern disposed on the cross-section thereof, at least a second wafer having at least a third pattern and at least a fourth pattern disposed on the cross-section thereof, and at least a sensing device, while pairing the first pattern with the third pattern and pairing the second pattern with the fourth pattern;
    (b) actuating the first wafer and the second wafer for enabling the first wafer to parallel the second wafer and to be a distance apart from the second wafer; and
    (c) actuating the first wafer and the second wafer for bringing the two wafers to move toward each other while enabling the sensing device to detect and determine whether or not the first pattern is in a position capable of matching with the third pattern and the second pattern in another position capable of matching with the fourth pattern,
    wherein the sensing device is a coupled charged device, the sensing device being utilized to detect the alignment patterns provided on wafer edges.

2. The method of claim 1, further comprising the step of:
    (d) bonding the first wafer and the second wafer while the first pattern matches the third pattern and the second pattern matches the fourth pattern.

3. The method of claim 1, further comprising the step of:
    (d) adjusting the first wafer and the second wafer for enabling the first pattern to match with the third pattern and maintaining the matching between the second pattern and the fourth pattern while the first pattern is in a position incapable of matching with the third pattern and the second pattern is in another position capable of matching with the fourth pattern; and
    (e) bonding the first wafer and the second wafer.

4. The method of claim 1, further comprising the step of:
    (d) adjusting the first wafer and the second wafer for enabling the first pattern to match with the third pattern and the second pattern to match with the fourth pattern while the first pattern is in a position incapable of matching with the third pattern and the second pattern is in another position incapable of matching with the fourth pattern; and
    (e) bonding the first wafer and the second wafer.

5. The method of claim 1, wherein each of the first, the second, the third, and the fourth pattern is selected from the group consisting of a two-dimensional figure and a three-dimensional structure.

6. The method of claim 1, wherein each of the first, the second, the third, and the fourth pattern is a three-dimensional structure.

* * * * *